(12) United States Patent
Baron et al.

(10) Patent No.: US 10,151,980 B2
(45) Date of Patent: Dec. 11, 2018

(54) METHOD FOR FINE LINE MANUFACTURING

(71) Applicant: Atotech Deutschland GmbH, Berlin (DE)

(72) Inventors: David Thomas Baron, Gloucestershire (GB); Sven Lamprecht, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 15/523,987

(22) PCT Filed: Dec. 9, 2015

(86) PCT No.: PCT/EP2015/079130
§ 371 (c)(1),
(2) Date: May 3, 2017

(87) PCT Pub. No.: WO2016/096571
PCT Pub. Date: Jun. 23, 2016

(65) Prior Publication Data
US 2017/0336710 A1   Nov. 23, 2017

(30) Foreign Application Priority Data

Dec. 16, 2014   (EP) .................................... 14198263

(51) Int. Cl.
*G03F 7/20*   (2006.01)
*G03F 7/09*   (2006.01)
(Continued)

(52) U.S. Cl.
CPC ........ *G03F 7/2002* (2013.01); *C23C 18/1605* (2013.01); *C23C 18/1893* (2013.01);
(Continued)

(58) Field of Classification Search
CPC ..................................................... G03F 7/2051
See application file for complete search history.

(56) References Cited

U.S. PATENT DOCUMENTS 3,380,831 A    4/1968  Cohen et al.
4,555,532 A    11/1985 Tanaka et al.
(Continued)

FOREIGN PATENT DOCUMENTS

EP    1117006      7/2001
JP    2005343115   12/2005
(Continued)

OTHER PUBLICATIONS

PCT/EP2015/079130; PCT International Search Report and Written Opinion of the International Searching Authority dated Feb. 29, 2016.

*Primary Examiner* — Kathleen Duda
(74) *Attorney, Agent, or Firm* — Renner, Otto, Boisselle & Sklar, LLP (57) ABSTRACT

A novel method for the manufacturing of fine line circuitry on a transparent substrates is provided, the method comprises the following steps in the given order providing a transparent substrate, depositing a pattern of light-shielding activation layer on at least a portion of the front side of said substrate, placing a photosensitive composition on the front side of the substrate and on the pattern of light-shielding activation layer, photo-curing the photosensitive composition from the back side of the substrate with a source of electromagnetic radiation, removing any uncured remnants of the photosensitive composition; and thereby exposing recessed structures and deposition of at least one metal into the thus formed recessed structures whereby a transparent substrate with fine line circuitry thereon is formed. The (Continued)

method allows for very uniform and fine line circuitry with a line and space dimension of 0.5 to 10 μm.

13 Claims, 3 Drawing Sheets (51) Int. Cl.
| | |
|---|---|
| G03F 7/095 | (2006.01) |
| G03F 7/11 | (2006.01) |
| C23C 18/16 | (2006.01) |
| C23C 18/18 | (2006.01) |
| C23C 18/20 | (2006.01) |
| C23C 18/28 | (2006.01) |
| C23C 18/30 | (2006.01) |
| C23C 18/40 | (2006.01) |
| H05K 3/18 | (2006.01) |
| H01L 23/15 | (2006.01) |
| H01L 21/48 | (2006.01) |
| H01L 21/285 | (2006.01) |
| H01L 21/288 | (2006.01) |
| H05K 3/00 | (2006.01) |

(52) U.S. Cl.
CPC ........ *C23C 18/2086* (2013.01); *C23C 18/285* (2013.01); *C23C 18/30* (2013.01); *C23C 18/40* (2013.01); *G03F 7/091* (2013.01); *G03F 7/094* (2013.01); *G03F 7/095* (2013.01); *G03F 7/11* (2013.01); *G03F 7/203* (2013.01); *G03F 7/2008* (2013.01); *G03F 7/2022* (2013.01); *H01L 21/285* (2013.01); *H01L 21/288* (2013.01); *H01L 21/4846* (2013.01); *H01L 23/15* (2013.01); *H05K 3/181* (2013.01); *H05K 3/184* (2013.01); *H05K 3/0082* (2013.01); *H05K 2201/0108* (2013.01); *H05K 2203/0709* (2013.01); *H05K 2203/1407* (2013.01)

(56) References Cited

U.S. PATENT DOCUMENTS

| | | | |
|---|---|---|---|
| 4,617,205 | A | 10/1986 | Darken |
| 4,812,387 | A | 3/1989 | Suzuki et al. |
| 4,992,354 | A | 2/1991 | Axon et al. |
| 5,395,740 | A | 3/1995 | Swirbel et al. |
| 7,220,296 | B1 | 5/2007 | Chowdhury et al. |
| 7,569,331 | B2 | 8/2009 | Dorogy et al. |
| 7,985,477 | B2 | 7/2011 | Schmidt et al. |
| 8,268,400 | B2 | 9/2012 | Nakahira et al. |
| 2003/0146019 | A1 | 8/2003 | Hirai |
| 2005/0276933 | A1 | 12/2005 | Prasad et al. |
| 2006/0199920 | A1 | 9/2006 | Okada et al. |
| 2006/0275711 | A1 | 12/2006 | Fu et al. |
| 2007/0036888 | A1 | 2/2007 | Funaki et al. |
| 2008/0223253 | A1 | 9/2008 | Song et al. |
| 2009/0191491 | A1 | 7/2009 | Ganjei et al. |
| 2010/0288539 | A1* | 11/2010 | Washima ............. H05K 3/0082 174/254 |
| 2013/0105329 | A1 | 5/2013 | Matejat et al. |
| 2013/0164932 | A1 | 6/2013 | Lee et al. |
| 2014/0242264 | A1 | 8/2014 | Stenhauser et al. |
| 2015/0056383 | A1 | 2/2015 | Pedrosa et al. |
| 2016/0273112 | A1 | 9/2016 | Bruning et al. |

FOREIGN PATENT DOCUMENTS

| | | |
|---|---|---|
| KR | 20140086662 | 7/2014 |
| WO | 2014104846 | 7/2014 |

\* cited by examiner

METHOD FOR FINE LINE MANUFACTURING

The present application is a U.S. National Stage Application based on and claiming benefit and priority under 35 U.S.C. § 371 of International Application No. PCT/EP2015/079130, filed 9 Dec. 2015, which in turn claims benefit of and priority to European Application No. 14198263.7 filed 16 Dec. 2014, the entirety of both of which is hereby incorporated herein by reference.

FIELD OF THE INVENTION

The invention relates to a process for the manufacturing of fine line circuitry. The process is suitable for the manufacture of printed circuit boards, IC substrates, high density interconnects and advanced package substrates and the like on transparent substrates.

BACKGROUND OF THE INVENTION

The ongoing miniaturization of electronic devices requires sophisticated processes which allow for better line and space density (L/S) without adding significantly to the cost of the thus obtained devices. Line width and inter line distance of 10 µm (10 µm line and space—L/S) or less are currently difficult to achieve with high yield in high volume manufacturing, while sub-micron dimensions are commonplace when silicon processing methods are adopted.

Generally, fine line circuitry is produced by the so-called Semi-Additive Process (SAP). This process consists of providing a substrate with a layer of copper on its (entire) surface. Then, a dry film resist is placed on those portions of the copper layer which shall later act as conductive lines. The redundant copper is removed by an etching step. Finally, the dry film is removed again. This process works well for devices having a copper line thickness of 10 to 30 µm or greater such as high density interconnects and wherein the individual copper lines have similar line widths. When decreasing the size of copper lines below 10 µm the process becomes too unreliable and produces too much scrap to be used economically. When substrates with copper structures of strongly differing line widths are to be formed, the Semi-Additive process suffers from local current density distribution effects which result in nonconformal plating results. The smaller lines often suffer from overburdens while the broader lines are only partly filled.

U.S. Pat. No. 8,268,400 B2 discloses a method of manufacturing fine line structures suitable for IC substrates. The process described therein comprises the steps of a) depositing conductive particles on the surface of a base material, b) electrifying the base material and thereby using the fine particles as cathode, c) electroless plating onto the charged conductive particles. The conductive particles may be deposited in a formulation further comprising a photosensitive resin which may be subjected to an UV-irradiation also using a photo mask to allow for a structuring to be obtained.

EP 0 243 121 A2 concerns a process for the manufacturing of electrically conductive circuit patterns on transparent substrates comprising the steps of a) forming a structured conductive film made of indium tin oxide or antimony doped tin oxide for example by screen printing, b) forming a first non-transparent coat thereon, c) baking the first coat, d) forming a second coat on the entire surface of the substrate, e) optionally, pre-baking the second coat, f) irradiating with a light source from the back of the substrate and thereby curing the part of the second film which is not on top of the first film, g) removing the uncured film, h) optionally, post-baking the second film. The first coat may be an organic polymer containing a dye or a pigment which then inhibits the curing of the second coat in step f) which is placed on top of the first coat. This process is a very arduous process and does not allow for very fine lines to be formed. Further, the document fails to teach any plating process and relates effectively, to three-colour filters used in liquid crystal displays.

Lasers are used widely in the packaging industries nowadays. One paramount advantage of lasers is the focussed beam which even can be used to structure metals or dielectrics. Hence, an alternative to the above-outlines Semi-Additive process is a laser cutting process of dielectrics or electrolytic copper layers formed on substrates. This, however, is a time-consuming process and, therefore, not suitable for any mass market application.

U.S. Pat. No. 7,569,331 B2 teaches a laser-induced structuring process of a layer consisting of a binder, metal nanoparticles and an adsorption propagation material. The binder can be evaporated with the laser and thus, the remaining metal nanoparticles on the surface result in conductive layers (col. 3, l. 52-57) or lines (col. 4, l. 6-20).

US 2005/0276933 A1 relates to a conductive pattern manufacturing method using sources of electromagnetic energy such as lasers. The process comprises a) providing a substrate made of plastic, polyester or glass, b) depositing a gold nanoparticle containing toluene solution selectively by ink-jet printing or on entire parts of the surface, and c) removing volatiles by laser and melting the gold nanoparticles to form a pattern on the substrate. The gold layers can be further structured by microembossing.

WO 2013/024280 A1 teaches the use of a process for the fine line circuit patterns comprising the steps of a) providing a substrate, b) depositing an ink comprising nanoparticles on said substrate, c) heating the ink with a laser in order to remove any volatiles and thereby forming a structured layer of the nanoparticles, and d) removing any uncured nanoparticles from the surface. Furthermore, the thus formed layers can be used to electrolytically deposit copper thereon. This deposition is not directed and will unfavourably increase the size of the thus formed lines and trenches, e.g. in the lateral direction. This lateral growth of the copper trenches results in an undesired decrease of the gaps between the individual copper lines.

US 2003/0146019 A1 discloses a similar method of depositing metallic nanoparticles on a dielectric substrate and sintering these nanoparticles with a laser to yield a conductive pattern thereon. The document remains silent about any further metal deposition on said pattern.

A further common issue in the manufacturing of fine line circuitry is the problem of over-plating. The electrolytic deposition of metals into trenches and holes formed in dielectrics often results in an overburden of metal formed next to such trenches and holes. This is especially the case for panel plating processes but occurs also for the Semi-Additive Process (see above). This is of particular relevance when attempting to fill trenches and holes having dimensions of below 10 µm (line and space). A special form of over-plating is called mushroom plating in the art. This mushroom plating often occurs when small trenches and holes are filled with metals and the metal deposition results in excess plating which has a mushroom-like appearance in a cross-section.

Objectives of the Invention

It is therefore an objective of the present invention to provide a process for the formation of fine line circuitry which overcomes the above mentioned limitations. It is another objective of the present invention to avoid the problems of mushroom plating or over-plating. It is still another objective of the present invention to provide a process which allows for uniformly distributed metal or metal alloy lines to be formed.

SUMMARY OF THE INVENTION

The above mentioned objectives are solved by the process according to the invention for the manufacturing of fine line circuitry on a transparent substrate which comprises the steps in the given order of
(i) providing a transparent substrate (100) having a front side (100a) and a back side (100b);
(ii) providing a pattern of light-shielding activation layer (101) on the front side (100a) of said substrate (100);
(iii) placing a photosensitive composition (102) on the front side (100a) of the substrate (100) including the pattern of light-shielding activation layer (101);
(iv) photo-curing the photosensitive composition (102) from the back side (100b) of the substrate (100) with a source of electromagnetic radiation;
(v) removing any uncured remnants of the photosensitive composition (102a); and thereby selectively exposing recessed structures (104) on the pattern of light-shielding activation layer (101); and
(vi) depositing of at least one metal or metal alloy (105) into the thus formed recessed structures (104) by electroless plating.

The metal or metal alloy (105) deposited into the recessed structures (104) forms the fine line circuitry. It is an advantage of the present invention that fine line circuitry can be manufactured with metal or metal alloy line sizes having a line width of 0.5 μm to 10 μm and therefore allows for a line and space density (L/S) of 0.5 to 10 μm to be obtained reliably.

It is particularly useful that the present invention provides a method for the formation of metal or metal alloy lines having a line width of 0.5 μm to 10 μm. The use of electroless plating in step (vi) allows for the minute structures formed in steps (i) to (v) to be filled selectively without damaging them. Other methods such as gas phase deposition methods or electrolytic plating unselectively deposit metal on the surface which requires steps to remove the metal or metal alloy from the undesired areas. Blade applications such as those disclosed in WO 2014/104846 A1 are not suitable to fill the minute structures formed in steps (i) to (v) because a force has to be applied in said case resulting in a damaging of those structures. Metal or metal alloy lines having a line width of 0.5 μm to 10 μm can thus not be formed.

It is a further advantage of the present invention that fine line circuitry can be manufactured without any over-plating which reduces the amount of metal waste and omits the chemical-mechanical polishing step required to remove any over-plated metals.

It is yet another advantage of the present invention that the metal or metal alloy structures such as trenches formed therewith are uniform in height. This is beneficial for the current distribution within the device.

BRIEF DESCRIPTION OF THE FIGURES

FIG. 1 is a schematic representation of the process according to the present invention providing fine lines of metals or metal alloys on transparent substrates.

FIG. 2 is a schematic representation of the process according to the present invention providing fine lines of metals or metal alloys on transparent substrates with through holes filled with conductive substances such as metals.

FIG. 3 is a schematic representation of a preferred embodiment of the process according to the present invention providing fine lines of metals or metal alloys on transparent substrates.

DETAILED DESCRIPTION OF THE INVENTION

Figure 1A:
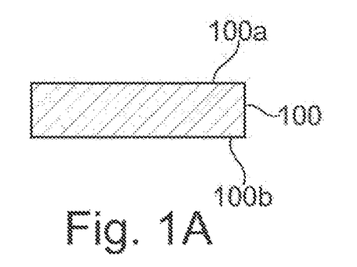

In the first step (i) of the process according to the invention as shown in FIG. 1A, a substrate (100) is provided. This substrate has a front side (100a) and a back side (100b) which are located opposite to each other. Preferably, the front side (100a) and the back side (100b) are parallel to each other. Substrates to be used in the process according to the present invention are transparent substrates. Transparency in the context of the present invention is to be understood that electromagnetic radiation used in step (iv) to photo-cure the photosensitive composition which is located on the front side (100a) of the substrate (100) can substantially transmit the substrate (100). Substantial transmission is preferably to be understood that 80% of the electromagnetic radiation can pass through the transparent substrate, i.e. the electromagnetic radiation is neither absorbed nor reflected by the transparent substrate (100). If the substrate only allows for a lower transmission of the electromagnetic radiation it is possible to increase the time for the photo-curing of the photosensitive composition in step (iv) in order to achieve fully photo-cured photosensitive compositions on the front side (100a) of the substrate (100).

The thickness of the transparent substrate (100) depends on the application of said substrate (100). It is preferred that the thickness of the transparent substrate (100) is below 3 mm, more preferably it ranges from 10 μm to 2 mm, even more preferred from 50 μm to 1 mm. Substrates (100) having a thickness exceeding 3 mm often allow for too low transmission of the electromagnetic radiation in step (iv) as light penetrating from the back side can be scattered and absorbed by the substrate (100). However, this can be remedied by increasing the time for the photo-curing of the photosensitive composition (102) in step (iv) in order to achieve fully photo-cured photosensitive compositions on the front side (100a) of the substrate (100).

Preferred materials for the substrates (100) to be used in the process according to the invention are glass and transparent polymeric materials. Suitable glass is selected from borosilicate glass, quartz glass, silica glass, fluorinated glass. Suitable transparent polymeric materials is selected from polyimide, polyethylene terephthalate, polyethylene, polypropylene, polyvinyl acetate, and polyvinyl alcohol, and mixtures and composites of the aforementioned. More preferred are borosilicate glass, quartz glass and silica glass as these materials are highly transparent for UV-light.

The substrate (100) may be cleaned, etched and/or rinsed optionally prior to any further processing. Such cleaning, etching and rinsing steps are known in the art. Cleaning may be done by contacting a substrate with a solvent and/or an aqueous solution comprising a surfactant or by plasma treatment, etching may be done by contacting a substrate with an alkaline and/or acidic aqueous solution, and rinsing may be done by contacting a substrate with water.

Figure 1B:
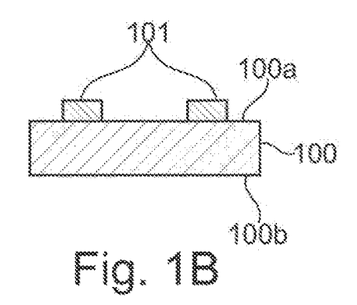

In step (ii) as shown in FIG. 1B, a pattern of light-shielding activation layer (101) on the front side (100a) of the substrate (100) is provided. This pattern of light-shielding activation layer (101) is provided by depositing a treatment solution on the front side (100a) of the substrate (100). Such a pattern of light-shielding activation layer (101) may be deposited by printing of the treatment solution on at least portion of the front side (100a) of the substrate (100), optionally followed by subsequent drying. This pattern of light-shielding activation layer (101) has a dual-functionality. It functions as light-shielding layer in step (iv) and therefore allows for selective curing of the photosensitive composition deposited in step (iii) and further as activation layer for the electroless metal deposition in step (vi).

The width of the pattern of light-shielding activation layer (101) ranges preferably from 0.1 to 30 µm, more preferred from 0.5 to 15 µm, even more preferred from 0.5 to 10 µm, most preferred from 1 to 7 µm. The height of the pattern of light-shielding activation layer (101) preferably is 1 nm to 1 µm, more preferred it ranges from 5 nm to 500 nm, even more preferred it ranges from 10 to 200 nm, most preferred it ranges from 25 to 100 nm.

The treatment solution may be deposited by printing methods or by the Semi-Additive process known in the art. Preferably, the treatment solution is deposited by printing methods. Printing methods are more preferably selected from the group consisting of ink-jet, screen printing or gravure printing. After deposition of the treatment solution on at least a portion of the front side (100a) of the substrate (100) the treatment solution is dried by means of elevated temperature and/or reduced pressure. This can be achieved by placing the substrate (100) with the treatment solution deposited thereon in an (vacuum) oven, a vacuum chamber, a laser or underneath an infrared dryer.

The treatment solution comprises at least one conductive, non-transparent particle or a precursor therefor, at least one solvent, and optionally one or more of surfactants, polymeric binders and/or adhesion promoters.

The treatment solution contains at least one conductive, non-transparent particle or precursor therefor. The conductive, non-transparent particles or precursors therefor may be metallic or non-metallic. Metallic conductive, non-transparent particles may be one or more from copper, palladium, platinum, silver, iron, titanium, nickel, tungsten, ruthenium particles and particles made of alloys of the aforementioned; non-metallic conductive, non-transparent particles may be one or more from carbon-based conductive, non-transparent particles and conductive polymers. Carbon-based conductive, non-transparent particles are electrically conductive carbon black, graphite, graphene and carbon nanotubes. Conductive polymers are for example polyaniline, polypyrrole, poly(3,4-ethylenedioxythiophene) polystyrene sulphonate (PEDOT:PSS) and polythiophene. Carbon-based and metallic conductive, non-transparent particles are preferred. Metallic conductive, non-transparent particles are more preferred. Copper and palladium particles are particularly preferred as conductive, non-transparent particles.

It is preferable that the average size ($d_{50}$) of the metallic and carbon-based conductive, non-transparent particles is in the range of 0.1 nm to 1 µm, more preferably in the range of 1 to 200 nm, even more preferably it is in the range of 2 to 100 nm, most preferably it is in the range of 5 to 50 nm. The use of smaller particles is preferred for two reasons. Smaller particles, especially nanoparticles having an average size ($d_{50}$) of 100 nanometers or less, have a significantly lower melting point than bulk material. Further, the adhesion forces between smaller particles such as nanoparticles are considerably higher than those among bulk materials.

After deposition of the treatment solution, it may be dried on at least a portion of the front side (100a) of the substrate (100). Upon drying the treatment solution after its deposition on at least a portion of the front side (100a) of the substrate (100), the solvent is removed and the distance between individual conductive, non-transparent particles is reduced and thereby a pattern of light-shielding activation layer (101) is formed. If the concentration and viscosity of the treatment solution is sufficiently high such a drying step might not be needed.

The expression "average size" is defined herein as the $d_{50}$ value of the particle size distribution obtained by dynamic laser scattering (DLS) measurement (number median of particle size distribution). The $d_{50}$ value of the particle size distribution means that 50% of the particles have a diameter below or equal to the given $d_{50}$ value. DLS measurements can be performed on an instrument DelsaNano C from BeckmannCoulter with measurement and instrument parameters settings: Light detection angle: 165°, Wavelength: 658 nm, Cell Center: z=6.3 mm; x=7.55 mm. Reproducibility of measurements can be reviewed for samples of particles in solution. The variation in intensity of laser light scattered from the particles can be auto-correlated to give the corresponding intensity distribution and the average particle diameter and the polydispersity index which can be calculated according to ISO 22412:2008.

Agglomeration is a typical phenomenon in dispersions containing small particles such as conductive, non-transparent metallic and non-metallic particles according to the invention. To prevent agglomeration surfactants and suitable protective colloids which may be polymers such as polyvinylpyrrolidinone (PVP) and starch or metallic protective colloids such as tin may be formulated with the conductive, non-transparent particles in the treatment solution.

In one embodiment of the invention, the treatment solution comprises a palladium/tin colloid as conductive, non-transparent particle. This colloid is obtained from a palladium salt, a tin(II) salt and an inorganic acid A preferred palladium salt is palladium chloride. A preferred tin(II) salt is tin(II) chloride. The inorganic acid can be hydrochloric acid or sulphuric acid, preferably hydrochloric acid. The colloid forms through reduction of the palladium chloride to palladium with the aid of the tin(II) chloride. The conversion of the palladium chloride to the colloid is complete; therefore, the colloid no longer contains any palladium chloride. When using a palladium/tin colloid as conductive, non-transparent particle it is advantageous to include an acceleration step in the process according to the invention directly after the deposition of the treatment solution (step (ii)) or directly before the electroless metal plating (step (vi)).

In one embodiment of the invention, the treatment solution comprises copper particles as conductive, non-transparent particles. Suitable copper particles can be prepared for the example by a reduction process of a copper salt such as copper sulphate dissolved in a solvent such as water in the presence of the surfactant and/or protective colloid such as polyvinylpyrrolidone (PVP). Upon reducing the copper salt with a reducing agent capable of reducing copper salts to metallic copper (for example sodium borohydride), metallic copper particles are formed and the surface of said copper particle is coated with the surfactant and/or protective colloid preventing reagglomeration. The progress of this reduction process can easily be monitored by colorimetric or spectroscopic methods. The average size of the metallic copper particles depends on various factors such as the concentration of the copper salt in the solution, the solvent, the strengths of the reducing agent, the concentration of the surfactant and/or protective colloid and the mechanism the surfactant and/or protective colloid may provide such as a electrosteric, steric and electrostatic stabilisation of the thus formed particles. Suitable synthetic methods for such metallic copper particles are widely known in the art and can be found for the example in T. Han et al., Optoelectronic and Advanced Materials—Rapid Communications, 2010, 4 (2), 180-183, section 2.2 therein. Further methods to synthesise copper nanoparticles are summarized in table 1 of S. Magdassi et al., Materials, 2010, 3, 4626-4638. Suitable copper nanoparticle dispersions are available from Intrinsiq Materials under the trade name CI-002.

In another embodiment of the present invention precursors for the conductive, non-transparent particles may be used. Examples therefor are palladium salts with reducing agents which form palladium particles in situ or monomers of conductive polymers which may be polymerized either in solution or when dried or deposited (electrodeposition). A typical palladium salt is palladium (II) chloride, suitable reducing agents are formaldehyde, formic acid, hypophosphite, glyoxylic acid or precursors thereof, boron based reducing agents such as borohydride or dimethylaminoborane, and hydrazine. Monomers are for example pyrrole, aniline or thiophene. The monomers may be polymerised by means known in the art.

The solvent is preferably selected to be one or more of water, monohydric alcohols such as methanol, ethanol, iso-propanol, n-propanol, n-butanol, iso-butanol, t-butanol, amylalcohol, glycols such as ethylene glycol, diethylene glycol, triethylene glycol, 1-methyl-1,2-dihydroxyethane, polar non-protic solvents such as dimethylformamide.

It is preferable to use only solvents or mixtures of solvents with boiling points of 200° C. or below, more preferably of 100° C. or below, to facilitate the removal of the solvent in a subsequent drying step.

The adhesion promoters which may optionally be added to the treatment solution are typically one or more of silanes, zirconates, titanates, mixtures, hydrolysates and condensation products of the aforementioned.

The binders which may optionally be added to the treatment solution are typically one or more of polyurethane, polyacrylate, silicone, polysiloxane, and epoxy-based materials. These optional binders and adhesion promoters are to increase the adhesion of the conductive, non-transparent particles to the front side (100a) of the substrate (100).

The optional surfactant is selected to be one or more of non-ionic, anionic, cationic or amphoteric surfactants. This optional surfactant may provide stabilisation of the treatment solution by electrostatic, steric and/or electrosteric means. A protective colloid such as starch, PVP or tin may also be included in the treatment solution to stabilise individual conductive, non-transparent particles.

The treatment solution may further comprise one or more dyes and/or one or more pigments which improve the light-shielding properties of the layer to be formed upon drying.

The treatment solution may further comprise typical additives which are used to stabilise such dispersion. Typically, rheology modifiers such as thickeners or thixotropic additives can be added to modify the viscosity of the treatment solution. It may advantageous to increase the viscosity of the treatment solution in order to stabilise it or it may be advantageous to decrease its viscosity in case the treatment solution shall be sprayed onto the substrate. pH adjusters such as bases or acids may also be used in the treatment solution as it is known to those skilled in the art that the zeta-potential of particles contained therein is pH-dependent. Defoamers may be added to eliminate any foam formation during the deposition of the treatment solution.

The concentration of conductive, non-transparent particles or precursors therefor in the treatment solution may vary widely depending on the application and the size of the particles therein as well as their stabilisation. Typically, smaller particles allow for only lower concentrations in the treatment solution as the tendency for agglomeration increases with decreasing size thereof. Generally but not limiting, the concentration of conductive, non-transparent particle or a precursor therefor in the treatment solution ranges from 0.1 to 95 wt.-%, preferably from 0.5 to 30 wt.-%, more preferred from 1 to 15 wt.-%.

Optionally, rinsing and cleaning steps as they are known in the art may be included after step (ii) in order to remove dust, soil or the like which is particularly detrimental to the deposition of liquid and printable resists in step (iii).

Figure 1C:
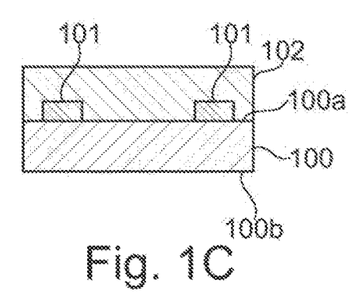

In step (iii) as shown in FIG. 1C, a photosensitive composition (102) is deposited on the substrate (100) including the formed pattern of light-shielding activation layer (101). The photosensitive composition (102) may be placed on the entire front side (100a) of the substrate (100) including the light-shielding activation layer (100) or on a portion thereof. Suitable photosensitive compositions are selected from materials such as dry films (sometimes referred to as dry resists or dry film resists in the art), liquid resists, printable resists and photo-imageable dielectrics. Preferably, the photosensitive composition is a dry film.

A dry film comprises at least one resin (sometimes also referred to as binder in the art), at least one photoinitiator and at least one polymerizable compound.

Further to the aforementioned components, a dry film may also comprise compounds such as stabilizers and fillers.

The at least one resin contained in the dry film may be selected from a polymer material selected from one or more of acrylates, ethylene/ethylacrylate copolymer (EEAC), ethylene/methacrylate copolymer (EMA), ethylene/acrylic acid copolymer (EAA), ethylene/butylacrylate copolymer (EBA), polymethylpentene (PMP), polymethylmethacrylate (PMMA), silicone, siloxane, polyimide, polyamide, polyvinyl acetate, polyvinyl acetate/(meth)acrylate, hydrolyzed polyvinyl acetate, ethylene/vinyl acetate copolymers, polystyrene copolymers with maleic anhydride and esters, polyvinylidene chloride, vinylidene chloride/acrylonitrile copolymers, vinylidene chloride/methacrylate copolymers, vinylidene chloride/vinyl acetate copolymers, polyvinyl chloride, polyvinyl chloride/acetate, saturated and unsaturated polyurethanes, butadiene/acrylonitrile copolymers, acrylonitrile/butadiene/styrene copolymers, methacrylate/acrylonitrile/butadiene/styrene copolymers, 2-chloro-butadiene-1,3 polymers, chlorinated rubber, styrene/butadiene/styrene, styrene/isoprene/styrene block copolymers, high molecular weight polyethylene oxides of polyglycols having average molecular weights from about 4,000 to 1,000,000, epoxides containing acrylate or methacrylate groups, copolyesters such as those prepared from the reaction product of a polymethylene glycol of the formula $HO(CH_2)_nOH$ where n is a whole number 2 to 10, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (a) terephthalic, isophthalic and sebacic acids and (b) terephthalic, isophthalic, sebacic and adipic acids; nylons or polyamides such as N-methoxymethyl polyhexamethylene adipamide, cellulose acetate, cellulose acetate succinate, cellulose acetate butyrate, methyl cellulose, ethyl cellulose, benzyl cellulose, polycarbonates, polyvinyl butyral, polyvinyl formal, and polyformaldehydes and epoxies or blends of the aforementioned.

Alternatively, it is possible to use alkali-resistant polymers as resins. Stability to alkaline media of the cured photosensitive composition is advantageous as many electroless metal plating baths such as those described herein are alkaline. Preferably, alkali-resistant polymers such as silicone-modified acrylates or blends of epoxy resins with silicone—modified acrylates (see for example F. Habib, M. Bajpai, Chemistry & Chemical Technology, 2010, 4 (3), pages 205 to 216), alkali-resistant epoxy resins such as those disclosed in EP 0 138 209 A2 or cationically polymerizable composites such as those disclosed in U.S. Pat. No. 7,985,477 B2 are used as resins. The choice of resin depends on the developer solution used in the later step to remove any uncured resin from the surface and vice versa.

In another preferred embodiment, polymer materials for the resin are selected from the group consisting of acrylates, epoxides containing acrylate or methacrylate groups and epoxies and polymethylpentene. More preferred are polymer material for the resins which are acrylates with a molecular weight Mw of 20000 to 200000, more preferred 25000 to 150000, and most preferred 30000-100000. The $T_g$ of the polymer shall be in the range of 20 to 300° C., more preferred 30 to 280° C., and most preferred 40 to 250° C., as measured according to ISO11357-1. A molecular weight too high will lead to reduced solubility in the chosen solvent. With a molecular weight too low, the sensitivity to the process solutions (alkaline, oxidizing, and acidic) tends to be insufficient. The $T_g$ must also not be too low because in this case the sensitivity to the polymer film is insufficient at the elevated temperature of the processing chemicals.

The polymerizable compound is a monomer, an oligomer or a polymer having at least one, preferably two olefinic double bonds. The polymerizable compound polymerizes upon exposure to electromagnetic radiation to form a highly cross-linked web, entangling the resin, so that the exposed area becomes less soluble in the developer solution and exhibits sufficiently mechanical and chemical resistance to serve as plating resist. Examples of compounds suitably used as polymerizable compound are vinyl ethers, acrylates, compounds with allyl groups, styrene and derivates thereof. Suitable examples for polymerizable compounds are known in the art and may be found in U.S. Pat. No. 3,380,831, EP 1 117 006 A1 and WO 2009/097051 A1.

Suitable dry film compositions are disclosed for example in EP 1 117 006 A1, WO 2009/097051 A1, U.S. Pat. No. 4,992,354 A, US 2006/0199920 A1. Suitable dry films and resins used therefor are commercially available exemplary from DuPont™ under the trade name WBR 2000 and Riston® Special FX 900 Series, from Cygnet Electronics Ltd. under the trade name Opti-tec 5013, from Masterbond Inc. under the trade name UV 15X-5, from Hitachi Chemicals Co. Ltd. under the trade name PHOTEC RD-2015.

The photoinitiators are known in the art and chosen depending on their properties such as solubility in the dry film formulation. Typically, peroxo compounds such as benzoyl peroxide, persulphates such as ammonium persulphate and azo compounds such as azobisisobutyronitrile are used. Further, chain transfer agents such as sulphur-containing compounds such as alkylthiols, dialkyldisulphides or thiocarboxylic acids or alkyl alcohols may be used in order to adjust the molecular weight of the polymer. Further, sensitizers such as acetone and benzophenone may be included in the dry film formulation.

Stabilizers such as hydrochinones may be added to increase the lifetime of the dry film formulation and its resistance to thermal curing. Plasticisers such as phthalates, polyethyleneoxides or polyglycols can be added to modify the flexibility and hardness of the dry film. Aromatic triazoles, thioazoles, silanes such as 3-glycidoxypropyltrimethoxysilane and aliphatic imidazoles as components contained in the dry film formulation can be used to increase the adhesion of the dry film to the underlying substrate. Fillers such as those disclosed in WO 2012/016932 A1 may be added to increase the mechanical properties of the dry film.

Generally, dry films contain about 50 to 90% by weight resin, 9.99 to 40% by weight polymerizable compound, 0.01 to 10% by weight photoinitiator.

Liquid resists are known in the art and are commercially available. Suitable compositions which may be used as liquid resists in the present invention are commercially available from Henkel under the trade names Loctite® 3192™, 3193HS™, 3194™, 3195™, 5192™. Similarly, photoimageable dielectrics are known in the art. Suitable compositions which may be used as photoimageable dielectrics are commercially available from Dow under the trade names Cyclotene™ 3000, 4000 and 6000.

The photosensitive composition (102) may be deposited onto at least a portion of front side (100a) of the transparent substrate (100) and the pattern of light-shielding activation layer (101) in form of a liquid by methods such as dip coating, spin coating, bar coating, curtain coating, spraying, screen printing, electrophoretic deposition and roller coating. In another embodiment a dry film on a carrier foil is first made from the liquid resin and this dry film is then laminated onto the front side (100a) of the transparent substrate (100) and the pattern of light-shielding activation layer (101) for example by hot roll lamination, wet lamination or vacuum lamination. Such a carrier foil is required because the polymer materials used later on as the resin in the dry film cannot be manufactured as a foil. The preferred method for depositing the photosensitive composition onto the transparent substrate are roller coating of the liquid resin, screen printing of the liquid resin, dipping of the substrate, or lamination of the respective dry film (consisting of the dry film and a carrier foil) onto the front side (100a) of the substrate (100) and the pattern of light-shielding activation layer (101). More preferred are screen printing of the liquid resin, roller coating of the liquid resin, and lamination of a respective dry film (consisting of the dry film and a carrier foil) onto the front side (100a) of the transparent substrate (100). Most preferred are lamination of a respective dry film (consisting of the dry film and a carrier foil) onto the front side (100a) of the transparent substrate (100) and the pattern of light-shielding activation layer (101).

The layer formed by the photosensitive composition (102) preferably has a thickness of 0.1 to 20 µm, preferably 1 to 15 µm, more preferably to 2 to 12 µm, most preferably 5 to 10 µm.

In a preferred embodiment of the present invention the refractive index of the photosensitive composition $n_P$ is substantially the same as the refractive index of the transparent substrate $n_T$. Substantially the same is to be understood that the difference of the respective refractive indices is very small, i.e. below 0.1. The difference $\Delta n$ of the refractive index of the transparent substrate $n_T$ and the refractive index of the photosensitive composition $n_P$ is preferably between 0.0 and 0.1, more preferably between 0.0 and 0.05. Even more preferably, the difference $\Delta n$ of the refractive index of the transparent substrate $n_T$ and the refractive index of the photosensitive composition $n_P$ is in above captioned ranges of 0.0 to 0.1, most preferred 0.0 to 0.05, for the wavelength of the electromagnetic radiation used in step (iv). This allows for a better resolution of the fine line circuitry to be formed as scattering at the interphase of transparent substrate and photosensitive composition is avoided.

The refractive index of the various forms of glass ranges from 1.45 to 2.14 (sodium-D-line, λ=589 nm). Quartz glass has a refractive index of 1.46. The refractive index n of several commercially available and suitable photosensitive compositions is for example:

| Opti-tec 5013 (from Cygnet Electronics Ltd.) | n = 1.54 |
| Loctite 3192 ™ (from Henkel AG & Co. KG) | n = 1.50 |
| Loctite 3193HS ™ (from Henkel AG & Co. KG) | n = 1.52 |
| Loctite 3194 ™ (from Henkel AG & Co. KG) | n = 1.52 |
| Loctite 3195 ™ (from Henkel AG & Co. KG) | n = 1.52 |

Figure 1D:
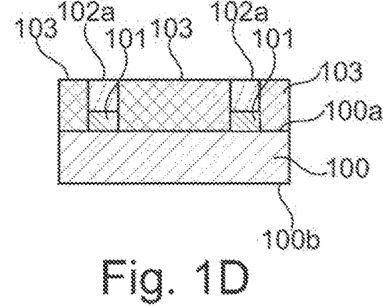

In step (iv) as shown in FIG. 1D, the substrate (100), the pattern of light-shielding activation layer and the photosensitive composition which are placed on the front side (100a) of said substrate (100) are exposed to electromagnetic radiation from the back side (100b) of the substrate (100). The electromagnetic radiation photo-cures (i.e. polymerises) the parts of the photosensitive composition which are not placed on top of the pattern of light-shielding activation layer (101) on the substrate (100) and thereby forms a photo-cured resin layer pattern (103). The pattern of light-shielding activation layer (101) inhibits the photosensitive composition placed thereupon (102a) to be photo-cured and said photosensitive composition remains uncured. The pattern of light-shielding activation layer (101) is thereby transferred onto the photosensitive composition (102) and the photo-cured resin layer pattern (103).

The electromagnetic radiation used in the present invention can be provided by any suitable source. Widely used sources are light sources as sources for electromagnetic radiation such as mercury lamps, high pressure xenon lamps or lasers such as argon lasers or excimer lasers. The wavelength of the light source is selected by those skilled in the art depending on the substrate and its transmission for a given wavelength, the photosensitive composition, and in particular on the photoinitiator used therein. If required suitable optical filters may be employed in order to absorb certain wavelengths of the emitted light. Typically, the light source comprises a wavelength which ranges from 50 to 600 nm, preferably it is in the UV range and the wavelength therefore ranges from 200 to 400 nm.

It is particularly preferred that the source of electromagnetic radiation is a source of light which allows for a high degree of collimation of light. Such high degree of collimation of light is achievable by using suitable mirrors and collimating lenses. This is particularly advantageous because this improves the resolution of the fine line circuitry to be formed. It is also advantageous to reduce the distance between the substrate and the source of electromagnetic radiation as much as possible because too large a distance is detrimental to the resolution of the fine line circuitry to be formed.

The photo-curing time and the energy of the electromagnetic radiation can be selected by the technical expert depending on the photosensitive composition, the photoinitiator comprised therein and its concentration therein and the substrate and the transmission of the latter for the given electromagnetic radiation.

Optionally, especially when using liquid resists and printable resists in step (iii), it may be useful to further dry the layer thermally before and/or after the following step (iv). This step is sometimes referred to as pre-bake or post-bake. Depending on the solvent which was employed for formulating the lacquer containing the resin layer, the oven temperature and the drying time have to be adjusted. It is important to achieve the desired hardness of the dried coating. Measurement of the hardness according to Koenig should be in the range of 20 seconds to 200 seconds, more preferred 40 seconds to 180 seconds, most preferred 60 seconds to 160 seconds.

Figure 1E:
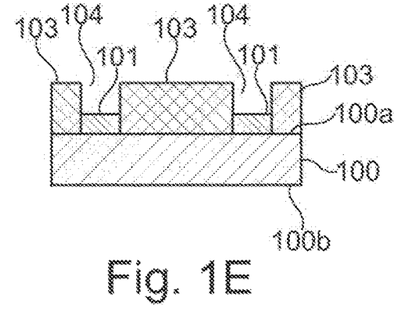

In step (v) as shown in FIG. 1E, any non-cured photosensitive composition (102a) is removed (stripped) from the transparent substrate (100) by contacting the non-cured photosensitive composition (102a) with a solvent and thereby recessed structures (104) are exposed. As the photo-curing of the photosensitive composition is defined by the pattern of light-shielding activation layer (101) in step (iv) also the recessed structures (104) are defined by the pattern of light-shielding activation layer (101). Suitable solvents to remove the non-cured photosensitive composition (102a) are known in the art and can be determined by routine experiments by those skilled in the art. A list of suitable solvents is disclosed in WO 2012/016932 A1 which is incorporated herein by reference in its entirety. The removal of uncured dry films, liquid resists, photo-imageable dielectrics and printable resists is sometimes referred to as developing procedure. Solutions used therefor are consequently referred to as development solutions.

Preferably, the solvent (development solution) is selected from the group consisting of benzyl alcohol, formic acid, dimethylacetamide, dimethylformamide, cyclohexanone, ethanolamine, triethanolamine, ethyleneglycol monobutylether acetate, ethyleneglycol monoethylether, weakly alkaline aqueous solutions such as 1 to 5 wt.-% $K_2CO_3$ or ammonia in water and mixtures thereof.

The non-cured photosensitive composition (102a) is contacted with the solvent by immersion, spraying, or dipping. For stripping purpose, the solvent is held at a temperature in the range of 5 to 100° C., more preferably 10 to 90° C. and most preferably 15 to 80° C. The contact time during stripping ranges from 1 to 600 seconds, more preferably from 10 to 540 seconds and most preferably from 20 to 480 seconds. During stripping, the transparent substrate (100), the photo-cured resin layer pattern (103) and the light-shielding activation layer (101) are not damaged. In the context of the present invention, recessed structures are to be understood as holes or trenches in the photo-cured resin layer pattern (103).

Figure 1F:
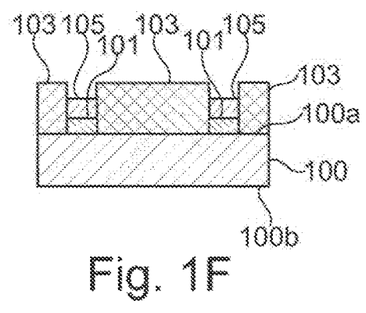

In step (vi) as shown in FIG. 1F, at least one metal or metal alloy is deposited into the thus exposed recessed structures (104) onto the light-shielding activation layer (101) by an electroless plating process and thereby at least one metal or metal alloy deposit (105) is formed in the recessed structures. Suitable plating bath formulations are known in the art for various metals which may be deposited into the recessed structures. Suitable metals or metal alloys to be deposited can be selected from copper, cobalt, nickel, gold, silver, palladium, platinum, ruthenium, alloys thereof or mixtures of the aforementioned. The deposited metal or metal alloy is preferably selected from copper and copper alloy. The light-shielding activation layer (101) in the recessed structures (104) catalyses the metal deposition process and allows for the selective deposition of the at least one metal or metal alloy into the recessed structures (104). The pattern of light-shielding activation layer (101) defines the photo-curing of the photosensitive composition in step (iv) and then also the exposed recessed structures (104) in step (v). By doing so, the pattern of light-shielding activation layer (101) hence also defines the metal or metal alloy deposition (105) which forms the fine line circuitry into said recessed structures (104). In conclusion, the pattern of light-shielding activation layer (101) defines the pattern of fine line circuitry formed in the inventive process. As the width of the recessed structures (104) is defined by the width of the light-shielding activation layer (101) also the width of the at least one metal or metal alloy deposit (105) formed in the recessed structures (104) is hence defined by the light-shielding activation layer (101).

A suitable plating bath for the deposition of copper comprises at least one source of copper ions and at least one reducing agent. Typically, at least one complexing agent is also contained therein. The electroless copper plating bath may comprise—and does not necessarily comprise—further components, as for example stabilizers, surfactants, additives, as rate controlling additives, grain refining additives, pH buffers, pH adjusters, exaltants and enhancers. Such further components are for example described in following documents, which are incorporated by reference in their entirety: U.S. Pat. No. 4,617,205 (particularly disclosure in col. 6, I. 17-col. 7, I. 25), U.S. Pat. No. 7,220,296 (particularly col. 4, I. 63-col. 6, I. 26), US 2008/0223253 (cf. particularly paragraphs 0033 and 0038).

The electroless copper plating bath comprises at least one copper ion source, which may for example be any water soluble copper salt. Copper ions may for example, and without limitation, be added as copper sulphate, copper chloride, copper nitrate, copper acetate, copper methane sulphonate ($Cu(CH_3O_3S)_2$) or hydrates thereof. The concentration of copper ions in the inventive electroless copper plating bath preferably ranges from 1 to 5 g/l, corresponding to 0.016 to 0.079 mol/l.

The electroless copper plating bath comprises at least one reducing agent. Suitable reducing agents are for example, without limitation, formaldehyde, paraformaldehyde, glyoxylic acid, or sources of glyoxylic acid, aminoboranes such as dimethylaminoborane, alkali borides such as $NaBH_4$, $KBH_4$, $NaH_2PO_2$, hydrazine, polysaccharides or sugars such as glucose, hypophosphoric acid, glycolic acid or formic acid, or salts of aforementioned acids. If the electroless copper plating bath contains more than one reducing agent it is preferable that the further reducing agent is an agent that acts as reducing agent but cannot be used as the sole reducing agent (cf. U.S. Pat. No. 7,220,296, col. 4, I. 20-43 and 54-62). Such further reducing agent is in this sense also called an "enhancer".

The term "source of glyoxylic acid" encompasses glyoxylic acid and all compounds that can be converted to glyoxylic acid in aqueous solution. In aqueous solution the aldehyde containing acid is in equilibrium with its hydrate.

A suitable source of glyoxylic acid is dihaloacetic acid, such as dichloroacetic acid, which will hydrolyse in an aqueous medium to the hydrate of glyoxylic acid. An alternative source of glyoxylic acid is the bisulphite adduct as is a hydrolysable ester or other acid derivative. The bisulphite adduct may be added to the composition or formed in situ. The bisulphite adduct may be made from glyoxylate and either bisulphite, sulphite or metabisulphite.

The concentration of the reducing agent in the electroless copper plating bath agent preferably ranges from 2 to 20 g/l. In one embodiment of the present invention, the electroless copper plating bath comprises one or more reducing agents in the total concentrations thereof (i.e. in this connection the total amount of reducing agents) ranging from 0.027 to 0.270 mol/l, preferably 0.054 to 0.2 mol/l The electroless copper plating bath also typically comprises at least one complexing agent. Suitable complexing agents are for example, without limitation, alkanol amines such as triethanol amine, hydroxycarboxylic acids such as glycolic acid or tartaric acid, polyamino disuccinic acids as disclosed in WO 2014/154702 such as ethylenediamine-N, N'-disuccinic acid, ethylenediamine tetraacetic acid (EDTA), hydroxyethyl ethylene diamine triacetic acid (HEDTA), cyclohexanediamine tetraacetic acid, diethylenetriamine pentaacetic acid, and tetrakis (2-hydroxypropyl) ethylenediamine or salts of the aforementioned acids.

The concentration of the at least one complexing agent in the electroless copper plating bath preferably ranges from 5 to 50 g/l. In a further embodiment, the molar ratio of complexing agent, which means in this connection the total amount of complexing agent(s), to copper ions is 2:1 to 5:1, more preferably 3:1 to 5:1. This embodiment is particularly advantageous if the electroless copper plating bath is agitated during deposition, preferably agitated with air or an inert gas such as nitrogen or argon, and when a further reducing agent (also called "enhancer") is used in addition to a first reducing agent such as glyoxylic acid, wherein the further reducing agent is preferably selected from glycolic acid, hypophosphoric acid, or formic acid, most preferably glycolic acid.

Electroless copper plating baths using reducing agents mentioned above preferably employ a relatively high pH, usually between 11 and 14, or 12.5 and 14, preferably between 12.5 and 13.5, or 12.8 and 13.3. The pH is adjusted generally by potassium hydroxide (KOH), sodium hydroxide (NaOH), lithium hydroxide (LiOH), ammonium hydroxide or tetramethylammonium hydroxide (TMAH). Thus, the electroless copper plating bath may contain a source of hydroxide ions, as for example and without limitation one or more of the compounds listed above. A source of hydroxide is for example added if an alkaline pH of the solution is desired and if the pH is not already in the alkaline range by other constituents.

Stabilizers are compounds that stabilize the electroless plating solution against unwanted outplating in the bulk solution. The term "outplating" means unspecific and/or uncontrolled deposition of copper. Reduction of copper(II) should only occur on the desired substrate surface and not non-specifically in the whole bath. A stabilizing function can for example be accomplished by substances acting as catalyst poison (for example sulphur or other chalcogenide containing compounds) or by compounds forming copper (I)-complexes, thus inhibiting the formation of copper(I) oxide.

Suitable stabilizers are, without limitation, dipyridyls (2,2'-dipyridyl, 4,4'dipyridyl), phenanthroline, mercaptobenzothiazole, thiourea or its derivatives like diethylthiourea, cyanides like NaCN, KCN, $K_4[Fe(CN)_6]$, thiocyanates, iodides, ethanolamines, mercaptobenzotriazole, $Na_2S_2O_3$, polymers like polyacrylamides, polyacrylates, polyethylene glycols, or polypropylene glycols and their copolymers, wherein 2,2'-dipyridyl, diethyl-thiourea, $K_4[Fe(CN)_6]$, NaCN and mercapto-benzothiazole are particularly suitable. In one embodiment, the stabilizer is chosen, mainly for environmental and occupational health reasons, from a stabilizer that is free of cyanides. Thus, the solution of the present invention is preferably free of cyanides. In this connection, 2,2'-dipyridyl is a preferred stabilizer. Dipyridyl is preferably added in an amount of 1-10 mg/l.

Exaltants are sometimes referred to as accelerators in the art (see G. O. Mallory, J. B. Hajdu, Electroless Plating: Fundamentals And Applications, Reprint Edition, American Electroplaters and Surface Finishers Society, pp. 289-295). These compounds may be added to increase the plating rate without decreasing the plating bath stability. Suitable exaltants are, without limitation, propionitrile, and O-phenanthroline.

It is also possible to add a second metal salt to the electroless copper plating bath and thereby depositing a copper alloy into the recessed structures (104). Suitable metals to be deposited with copper are nickel and cobalt, preferably nickel. These metals may be added to the electroless copper plating bath as water soluble salts such as, without limitation, sulphates, nitrates, halides and typically in an amount sufficient to yield 0.5 to 1 wt.-% of second metal in the formed copper alloy deposit.

Suitable electroless copper plating bath are for example disclosed in WO 2014/154702 and WO 2013/050332. However, other electroless copper plating baths which fulfil the above-mentioned requirements may also be employed in the inventive process.

The electroless copper deposition of the present invention may be carried out at a temperature in the range of 20-60° C., preferably 20-55° C., more preferably 20-50° C., even more preferably 20-45° C., and most preferably 20-40° C.

The process of the electroless metal or metal alloy deposition is continued until the desired metal or metal alloy filling of the recessed structures is achieved. The ratio of height of the photo-cured resin layer pattern (103) to the electroless metal or metal alloy deposit ranges from 10 to 1:1, preferably 2.5 to 1.1:1.

Figure 1G:
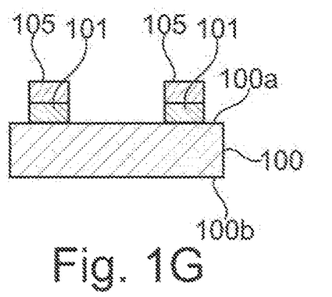
Figure 2A:
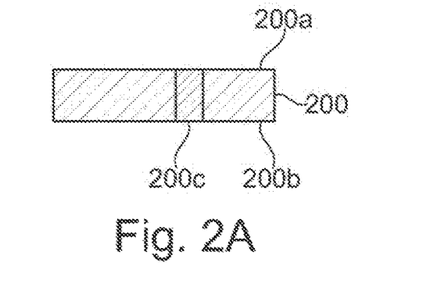
Figure 2B:
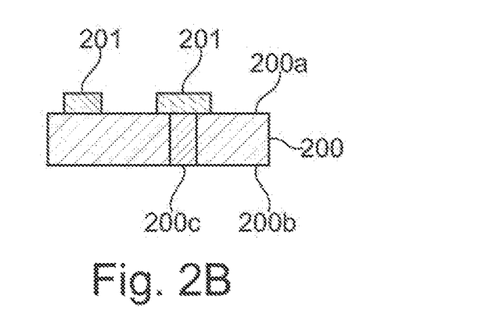
Figure 2C:
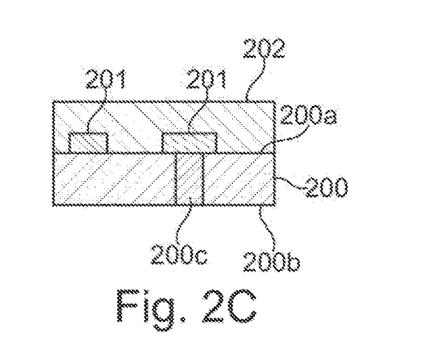
Figure 2D:
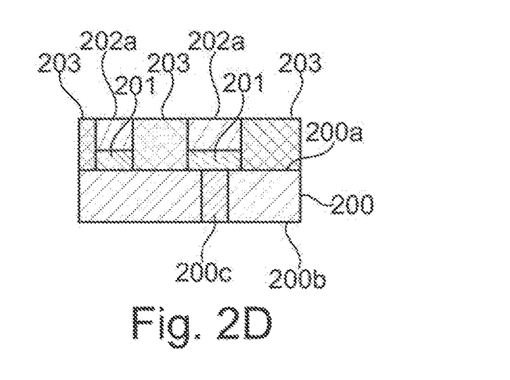
Figure 2E:
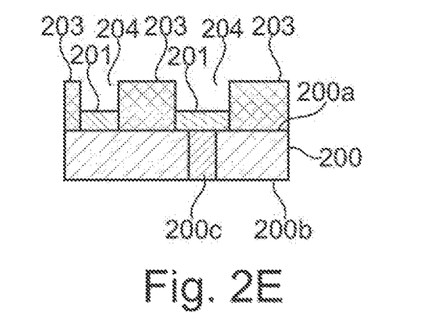
Figure 2F:
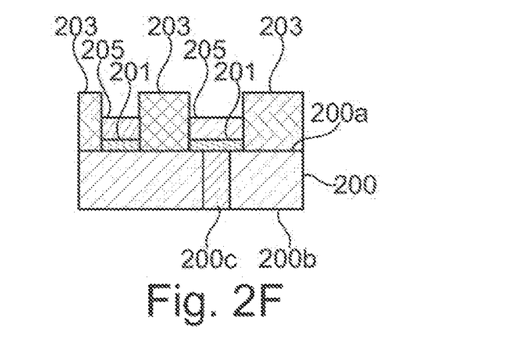
Figure 2G:
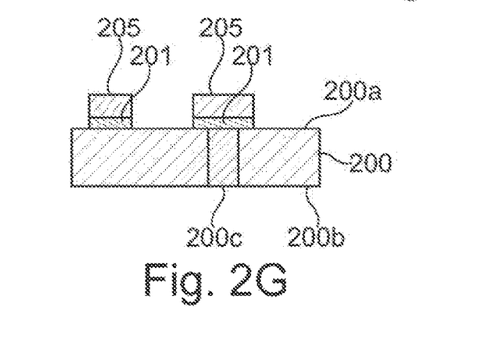

Optionally, as shown in FIG. 1G, the process may comprise a further step (vii)

(vii) to remove (strip) the photo-cured resin layer (103) after the deposition of the at least one metal or metal alloy (105) into the recessed structures (104) and thereby exposing the formed metal or metal alloy deposit (105).

Methods suitable for the removal (stripping) of such photo-cured resin layer (103) are known in the art. These methods include treatment of such photo-cured resin layer (103) with solvents and alkaline and/or acidic aqueous solution, optionally, comprising oxidisers such as hydrogen peroxide, persulphates or permanganate. The person skilled in the art will select suitable methods depending on the exact composition of the photo-cured resin layer (103) and on further circumstances such as the composition of the substrate (100) and the light-shielding activation layer (101).

The inventive process may include further rinsing, cleaning and etching step which are known in the art.

A further embodiment of the present invention is shown in FIG. 2. The substrate (200) is a transparent substrate which comprises through holes already filled with metals, metal alloys or other conductive substances. Substrates which comprise through holes already filled with metal or metal alloys are preferred. These through holes already filled with metals, metal alloys or other conductive substances will provide a conductive pathway to underlying layers of a more complex substrate. Naturally, they are light-shielding and therefore, a photosensitive composition placed thereupon will not be photo-cured in step (vi). As the metals, metal alloys or other conductive substances of conductive by nature they will catalyse electroless metal or metal alloy deposition. Hence, metal will be deposited thereon in step (vi). The steps (ii) to (vii) of the inventive method performed as described above and thereby a transparent substrate comprising through holes already filled with metals, metal alloys or other conductive substances with fine line circuitry thereon.

In an alternative embodiment the transparent substrate may already have conformal fillings of metal, metal alloys or other conductive substances (not shown) which are not through holes (e.g. trenches, blind micro vias). These conformal fillings then behave similar to above-described through holes. It is also possible to use substrates comprising through holes and conformal fillings.

Figure 3A:
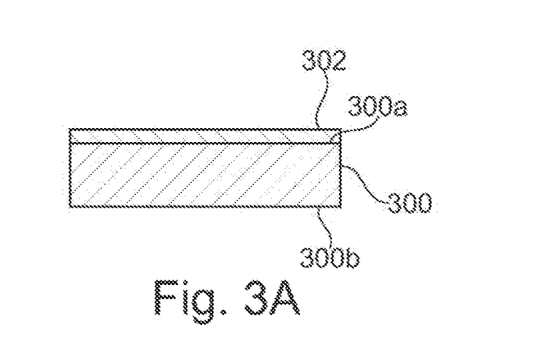
Figure 3B:
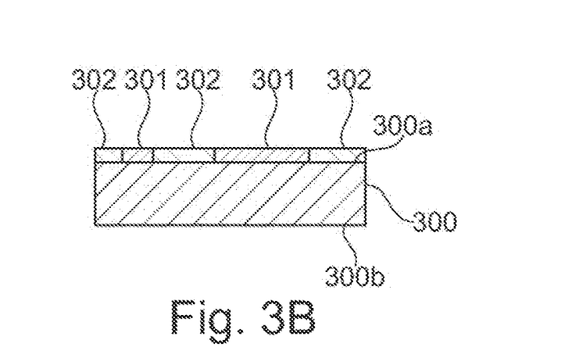
Figure 3C:
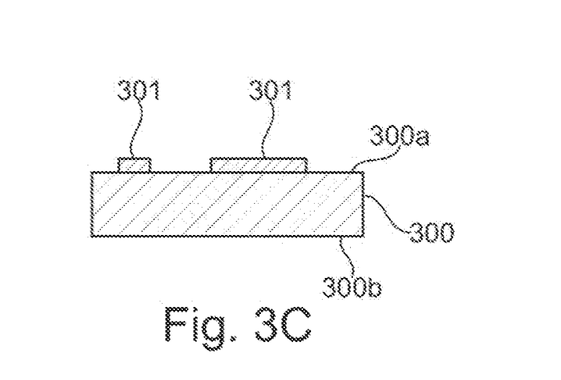

In an alternative and preferred embodiment (shown in FIG. 3) of the present invention step (ii) is performed by the following steps (ii.a) to (ii.c), in the given order, to provide a pattern of light-shielding activation layer (301) on of the front side (300a) of said substrate (300):

(ii.a) depositing a treatment solution (302) on at least a portion of the front side (300a) of said substrate (300);

(ii.b) selectively curing at least one portion of the before deposited a treatment solution (302) on the front side (300a) of said substrate (300) with a laser and thereby forming a pattern of light-shielding activation layer (301);

(ii.c) removing any uncured remnants of the treatment solution (302) from the substrate (300).

In step (ii.a) as shown in FIG. 3A, a treatment solution (302) is deposited on at least portion of the front side (300a) of the substrate (300). This a treatment solution (302) has above described dual-functionality when cured selectively in step (ii.b).

The treatment solution (302) may be deposited by printing methods such as ink-jet, screen printing or gravure printing, spraying, wiping, curtain coating, knife or roller application. It can be deposited on the entire surface of the front side (300a) of the substrate (300) or on one or more portions thereof. When using printing methods such as ink-jet, screen printing or gravure printing preliminary pattern may be formed. This is beneficial in the context of the present invention as the treatment solution is not deposited on areas of the front side of the substrate which ought not to be treated with the treatment solution and which are not to have a conductive circuitry thereon in the later stages of the process.

The treatment solution as described above can be used in this preferred embodiment and comprises at least a conductive, non-transparent particle or a precursor therefor, at least a solvent, and optionally one or more surfactants, polymeric binders and/or an adhesion promoters.

Further to the surfactants described above, light- or heat-labile surfactants such as those disclosed in O. Nuyken et al., Journal of Photochemistry and Photobiology, A: Chemistry, 1995, 85, pages 291-298; J. R. McElhanon et al., Langmuir 2005, 21 (8), pages 3259-3266; http://eckert.chbe.gat-ech.edu/pdf/surfactant.pdf (downloaded 12 Sep. 2014) can preferably be contained in the treatment solution of this preferred embodiment. Such light- or heat-labile surfactants contain a functional group which can be decomposed or converted by light or heat into another moiety whereby the wetting properties of the light- or heat-labile surfactant are altered. Such functional groups can be without limitation carbamates, sulphonyl, sulphoxide, diazosulphonate, and thiirane oxide. A treatment solution containing light- or heat-labile surfactants is advantageously employed in this preferred embodiment as the solidification of the treatment solution is accelerated upon selective curing with a laser in step (ii.b) compared to one which only contains non-labile surfactants.

As described above, the treatment solution may further comprise one or more dyes or one or more pigments which improve the light-shielding properties of the layer to be formed. Useful dyes or pigments of this preferred embodiment need to withstand laser treatments for a short period of time. Therefore, the use of inorganic pigments such as carbon black and (doped) iron oxide pigments like C.I. pigment black 11 is preferred. It is particularly preferred to use inorganic pigments having an average size $d_{50}$ of 5 μm or less, even more preferred of 10 nm to 2 μm, yet even more preferred of 50 nm to 0.5 μm.

The treatment solution of this preferred embodiment may further comprise compounds which facilitate the adsorption of a laser beam having a wavelength of less or equal of the wavelength of a laser to be employed in step (ii.b). Compounds suitable for the example for laser of wavelength of 800 nm are—but not limited to—silicon naphthalocyanine, indocyanine green, IR 780 iodide commercially available from Aldrich chemicals (CAS number 207399-07-3). Further compounds are known to those skilled in the art and can be chosen dependent on the laser and its wavelength to be employed in step (ii.b).

In step (ii.b) as shown in FIG. 3B, the treatment solution (302) is selectively cured with a laser. The focussed laser beam is scanned across the deposited treatment solution (302) and thereby forms a pattern of light-shielding activation layer (301). Accordingly, to ensure high resolution of the formed pattern the beam is focussed, or masked, to produce a spot size of between 1 and 100 μm, preferably below 10 μm, more preferably below 5 μm, depending on the size of features required. The size of structure formed is being dependent on the size of the laser spot. Upon selectively curing the beforehand deposited treatment solution (302) with the laser, the solvent and other volatile compounds evaporate, and thereby the pattern of light-shielding layer and activation layer (301) is formed. When using metallic conductive, non-transparent particles they may advantageously melt and solidify after laser treatment and form a continuous pattern.

Lasers are well known in the art. Lasers to be used in the present invention are not particularly limited. They can be continuous or pulsed and the wavelength of the laser may be in the range of UV, visible or infrared. Preferably, continuous lasers having a wavelength of 400 nm or greater are used in the process according to the invention because their beams penetrate more deeply into the deposited treatment solution (302) and allow for better adhesion to be achieved of the formed pattern of light-shielding activation layer (301) to the substrate (300). Alternatively, other types of lasers such as semiconductor lasers, excimer lasers, dye lasers, solid lasers, gas lasers, and free electron lasers may be used.

The laser may be adjusted by means known in the art such as lenses and masks or arrays therewith.

It is preferable to cure the treatment solution with the laser in an inert atmosphere or under reduced pressure to eliminate the risk of oxidising the pattern of light-shielding activation layer to be formed. This is especially useful when using copper particles, carbon-based particles or conductive polymers as conductive, non-conductive particles in the treatment solution.

In step (ii.c) as shown in FIG. 3C, any uncured remnants of the treatment solution (302) are removed from the surface of the substrate (300). Only the cured parts of the treatment solution which form the pattern of light-shielding activation layer (301) remain on the front side (300a) of the substrate (300). Removing the uncured remnants of the treatment solution can be achieved by rinsing with suitable solvents, acidic or alkaline solutions or by any suitable means known in the art.

Thereafter, the steps (iii) to (vi) are performed as described above and a transparent substrate with fine line circuitry thereon is formed.

The invention claimed is:

1. Process for the manufacturing of fine line circuitry on a transparent substrate, the process comprises the following steps in the given order
    (i) providing a transparent substrate having a front side and a back side;
    (ii) providing a pattern of light-shielding activation layer on the front side of said substrate; wherein the pattern of light-shielding activation layer is provided by the steps (ii.a) to (ii.c), in the following order:
        (ii.a) depositing a treatment solution on the front side of the substrate, wherein the treatment solution contains carbon-based conductive, non-transparent particles having a size in the range of 0.1 nm to 1 μm;
        (ii.b) selectively curing at least one portion of the deposited treatment solution on the front side of said substrate with a laser and thereby forming a pattern of light-shielding activation layer; and
        (ii.c) removing any uncured remnants of the treatment solution from the substrate;
    (iii) placing a photosensitive composition on the front side of the substrate including the pattern of light-shielding activation layer;
    (iv) photo-curing the photosensitive composition from the back side of the substrate with a source of electromagnetic radiation;
    (v) removing any uncured remnants of the photosensitive composition; and thereby selectively exposing recessed structures on the pattern of light-shielding activation layer; and
    (vi) depositing of at least one metal or metal alloy into the thus formed recessed structures by an electroless plating process.

2. The process according to claim 1, characterized in that the treatment solution is deposited by a printing method.

3. The process according to claim 1, characterized in that height of the pattern of light-shielding activation layer ranges from 1 nm to 1 μm.

4. The process according to claim 1, characterized in that the substrate is selected from the group consisting of borosilicate glass, quartz glass, silica glass, fluorinated glass, polyimide, polyethylene terephthalate, polyethylene, polypropylene, polyvinyl acetate, polyvinyl alcohol and mixtures and composites of the aforementioned.

5. The process according to claim 1, characterized in that the photosensitive composition is selected from dry films, liquid resists, printable resists and photo-imageable dielectrics.

6. The process according to claim 5, characterized in that the photosensitive composition is a dry film.

7. The process according to claim 1, characterized in that the layer formed by the photosensitive composition has a thickness 0.1 to 20 μm.

8. The process according to claim 1, characterized in that the metal or metal alloy deposited in step (vi) is selected from copper and copper alloy.

9. The process according to claim 1, characterized in that the process comprises a further step (vii) to remove a photo-cured resin layer formed in step (iv) after the deposition of the at least one metal or metal alloy into the recessed structures and thereby exposing the formed metal or metal alloy deposit.

10. The process according to claim 1 characterized in that a refractive index of the photosensitive composition $n_P$ is substantially the same as a refractive index of the transparent substrate $n_T$.

11. The process according to claim 1, characterized in that the source of electromagnetic radiation is a source of light which allows for a high degree of collimation of light.

12. The process according to claim 1, characterized in that fine line circuitry made of metal or metal alloy line sizes having a line width of 0.5 μm to 10 μm is manufactured.

13. The process according to claim 1, characterized in that the process comprises a further step (vii) to remove a photo-cured resin layer formed in step (iv) after the deposition of the at least one metal or metal alloy into the recessed structures and thereby exposing the formed metal or metal alloy deposit.

* * * * *